(12) United States Patent
Hsiao et al.

(10) Patent No.: US 10,530,078 B1
(45) Date of Patent: Jan. 7, 2020

(54) ELECTRONIC SIGNAL PROCESSING DEVICE

(71) Applicant: BizLink International Corp., New Taipei (TW)

(72) Inventors: Hsin-Tuan Hsiao, New Taipei (TW); Kuo-Yang Tsai, New Taipei (TW)

(73) Assignee: BizLink International Corp., New Taipei (TW)

( * ) Notice: Subject to any disclaimer, the term of this patent is extended or adjusted under 35 U.S.C. 154(b) by 0 days.

(21) Appl. No.: 16/249,879

(22) Filed: Jan. 16, 2019

(30) Foreign Application Priority Data

Oct. 19, 2018 (TW) .............................. 107137066 A

(51) Int. Cl.
| | |
|---|---|
| *H01R 12/70* | (2011.01) |
| *H05K 1/18* | (2006.01) |
| *H05K 1/11* | (2006.01) |
| *H05K 1/02* | (2006.01) |
| *H01R 12/71* | (2011.01) |
| *H01R 13/6474* | (2011.01) |
| *H05K 1/09* | (2006.01) |

(52) U.S. Cl.
CPC ....... *H01R 12/7052* (2013.01); *H01R 12/714* (2013.01); *H01R 13/6474* (2013.01); *H05K 1/0243* (2013.01); *H05K 1/09* (2013.01); *H05K 1/111* (2013.01); *H05K 1/181* (2013.01); *H05K 2201/10356* (2013.01); *H05K 2201/209* (2013.01)

(58) Field of Classification Search
CPC .............. H01R 12/7052; H01R 12/714; H01R 13/6474
USPC .......................................................... 439/55
See application file for complete search history.

(56) References Cited

U.S. PATENT DOCUMENTS

| | | | | |
|---|---|---|---|---|
| 5,356,308 | A * | 10/1994 | Toba | H01R 13/5219 439/422 |
| 7,204,648 | B2 * | 4/2007 | Aronson | H01R 23/688 174/33 |
| 7,410,381 | B2 * | 8/2008 | Tang | H01R 12/716 439/260 |
| 7,534,966 | B2 * | 5/2009 | Cho | H01R 12/57 174/260 |
| 8,029,314 | B2 * | 10/2011 | Huang | H01R 12/88 439/492 |
| 8,845,360 | B2 * | 9/2014 | Ohyama | H01R 12/62 439/499 |
| 9,202,160 | B2 * | 12/2015 | Han | G06K 19/07739 |
| 9,848,493 | B1 * | 12/2017 | Engel | H01R 12/57 |

(Continued)

FOREIGN PATENT DOCUMENTS

| | | |
|---|---|---|
| TW | I251378 B | 3/2006 |
| TW | M554647 U | 1/2018 |

*Primary Examiner* — Alexander Gilman
(74) *Attorney, Agent, or Firm* — CKC & Partners Co., LLC

(57) ABSTRACT

An electronic signal processing device includes a printed circuit board, a signal processing chip, a plurality of conductive lines, a plurality of copper pads, and a fixing device. The signal processing chip is mounted on the printed circuit board, and a plurality of conductive lines are formed on the printed circuit board and connected to the signal processing chip. The copper pads are respectively formed at the ends of the conductive lines. The fixing device is fixed on the printed circuit board and exposes the copper pads to connect to a cable assembly so as to improve signal integrity.

7 Claims, 3 Drawing Sheets

(56) References Cited

U.S. PATENT DOCUMENTS

| | | | | |
|---|---|---|---|---|
| 9,854,674 | B1* | 12/2017 | Chen | H01R 4/02 |
| 10,140,063 | B2* | 11/2018 | Worley | G06F 3/0688 |
| 2006/0035515 | A1* | 2/2006 | Pabst | H01R 12/79 |
| | | | | 439/492 |
| 2006/0035516 | A1* | 2/2006 | Wu | H01R 12/79 |
| | | | | 439/492 |
| 2006/0276059 | A1* | 12/2006 | Dittmann | H01R 12/526 |
| | | | | 439/67 |
| 2006/0281361 | A1* | 12/2006 | Uchida | H01R 12/79 |
| | | | | 439/492 |
| 2008/0045076 | A1* | 2/2008 | Dittmann | H01R 23/661 |
| | | | | 439/495 |
| 2010/0105251 | A1* | 4/2010 | Hiew | G06F 1/1632 |
| | | | | 439/638 |
| 2010/0261375 | A1* | 10/2010 | Wang | H01R 12/88 |
| | | | | 439/492 |
| 2012/0258618 | A1* | 10/2012 | Sasaki | H01R 12/78 |
| | | | | 439/260 |
| 2013/0065448 | A1* | 3/2013 | Chiu | H01R 13/6658 |
| | | | | 439/660 |

\* cited by examiner

ELECTRONIC SIGNAL PROCESSING DEVICE

RELATED APPLICATIONS

This application claims priority to Taiwan Application Serial Number 107137066, filed Oct. 19, 2018, which is herein incorporated by reference.

TECHNICAL FIELD

The present disclosure generally relates to an electronic signal processing device. More particularly, the present disclosure relates to a high frequency electronic signal processing device.

BACKGROUND

With the development and innovation of various high frequency electronic products, new high frequency electronic products require relatively more bandwidth. Therefore, the world today relies on the rapid and reliable information transmission.

As semiconductors continue to break through in technology, the semiconductors have been widely used in the computer bus architecture, network infrastructure, and digital wireless communication. In the computer industry, especially when the speed of the server computer processor has been upgraded to gigahertz (GHz), the memory transmission rate and the internal bus speed are also apparently increased. High-speed data transmission technology can support more powerful computer applications such as 3D games and computer-aided design programs. Advanced 3D images require a large amount of data transmission in the CPU, memory, and display card.

However, computer technology is only one part of the new information and bandwidth era. Digital communication engineers are also gradually adopting higher frequency data transmission technology in the new communication products. At the same time, in the field of digital high-definition video technology, the next generation of high-quality, interactive video equipment is being designed. Various new technologies continue to improve data transmission rates. Emerging serial bus is breaking the bottleneck of parallel bus architectures.

The increasing bandwidth is a challenge for digital system design. In the past, data interactions occurred in milliseconds, but now data interactions are measured in nanoseconds. Therefore, there is a need to transmit the required signals more accurately at a higher data transmission rate.

SUMMARY

One objective of the embodiments of the present invention is to provide an electronic signal processing device to increase the quality and speed of high frequency signal transmission.

To achieve these and other advantages and in accordance with the objective of the embodiments of the present invention, as the embodiment broadly describes herein, the embodiments of the present invention provides an electronic signal processing device including a printed circuit board, a signal processing chip, a plurality of conductive lines, a plurality of copper pads and a fixing device.

The signal processing chip is mounted on the printed circuit board, the conductive lines are formed on the printed circuit board and electrically connected to the signal processing chip. The copper pads, e.g. golden fingers, are respectively formed at end portions of the conductive lines. The fixing device is mounted on the printed circuit board to expose the copper pads for connecting to a cable assembly.

In some embodiments, the fixing device includes a U-shaped protecting shell fixed on the printed circuit board.

In some embodiments, the fixing device further includes a protecting lid coupled to the U-shaped protecting shell.

In some embodiments, the protecting lid includes a hinge pivoted to the U-shaped protecting shell.

In some embodiments, the protecting lid includes a fixing protrusion and the U-shaped protecting shell includes a fixing hole to fix the protecting lid on the U-shaped protecting shell.

In some embodiments, the U-shaped protecting shell includes a positioning fillister to couple to a positioning flange of the cable assembly. In addition, the protecting lid further includes a pressing flange to press the positioning flange of the cable assembly in the positioning fillister.

In some embodiments, the cable assembly includes a plurality of electrical contacts, and the electrical contacts include a plurality of varying width electrical contacts, e.g. signal electrical contacts.

Accordingly, the electronic signal processing device can not only be conveniently coupled to the cable assembly, but also the electrical contacts of the cable assembly can directly contact the copper pads of the circuit board so as to reduce the required connection components between the signal processing chip and the wire, thereby effectively improving the signal integrity (SI) and increasing the quality and speed of signal transmission. In addition, because that the widths of the electrical contacts are changed to improve the signal integrity, the signal integrity of the high frequency signal can be improved more effectively, and furthermore the quality and speed of the high frequency signal transmission are also effectively increased.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
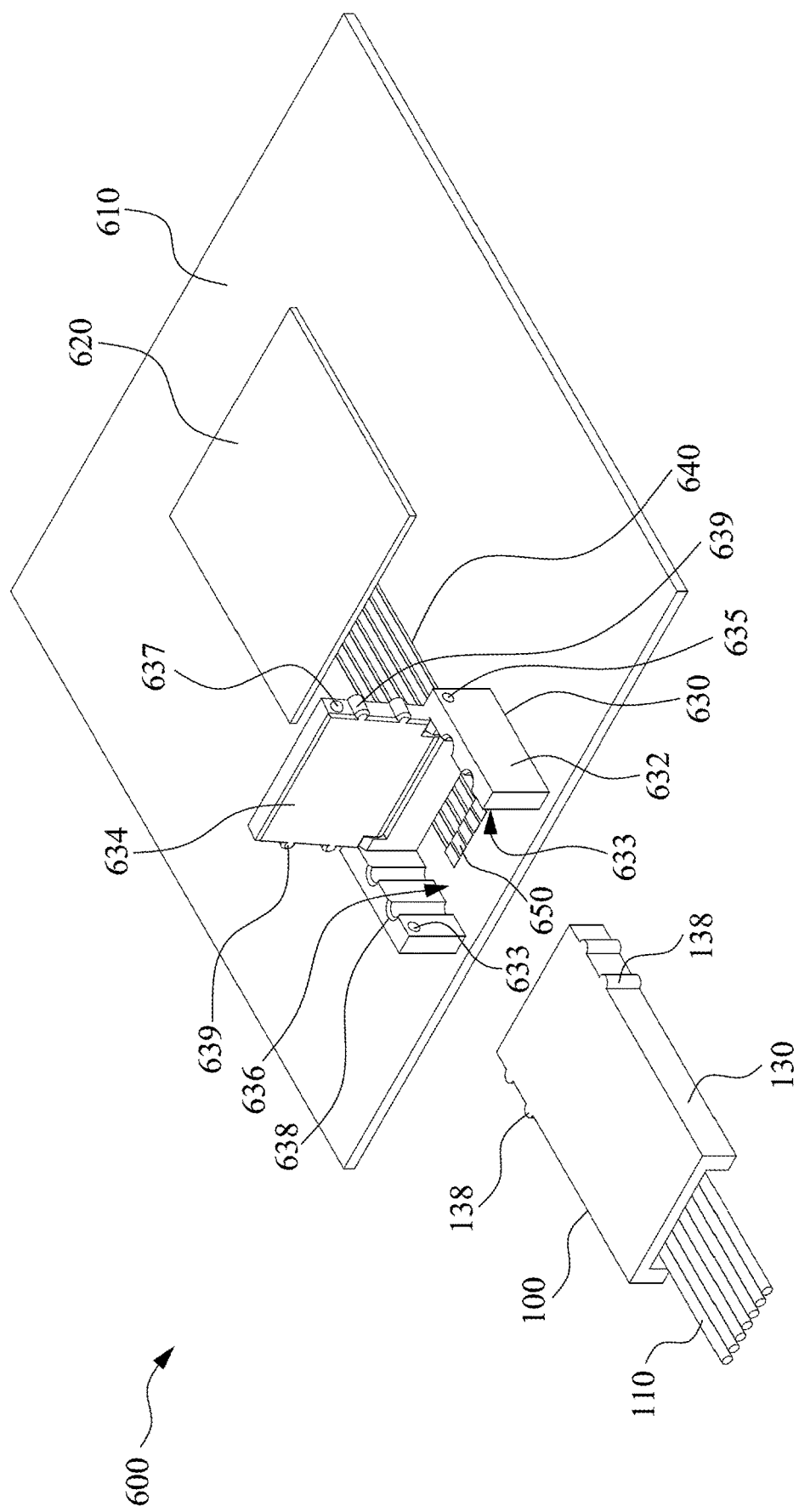
FIG. 1 illustrates a schematic perspective diagram showing an electronic signal processing device according to one embodiment of the present invention.
Figure 2:
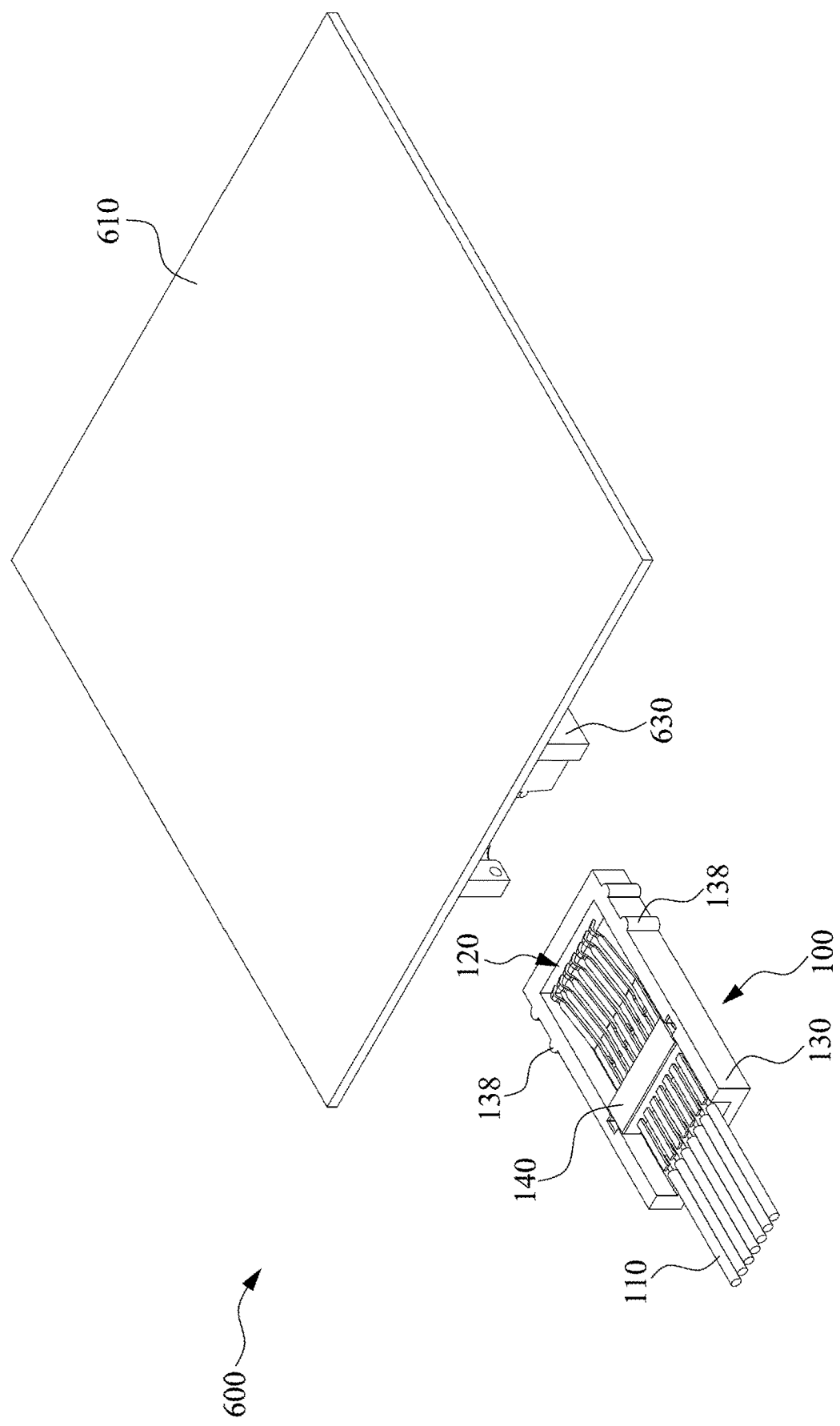
FIG. 2 illustrates a schematic rear perspective diagram showing an electronic signal processing device according to one embodiment of the present invention.
Figure 3:
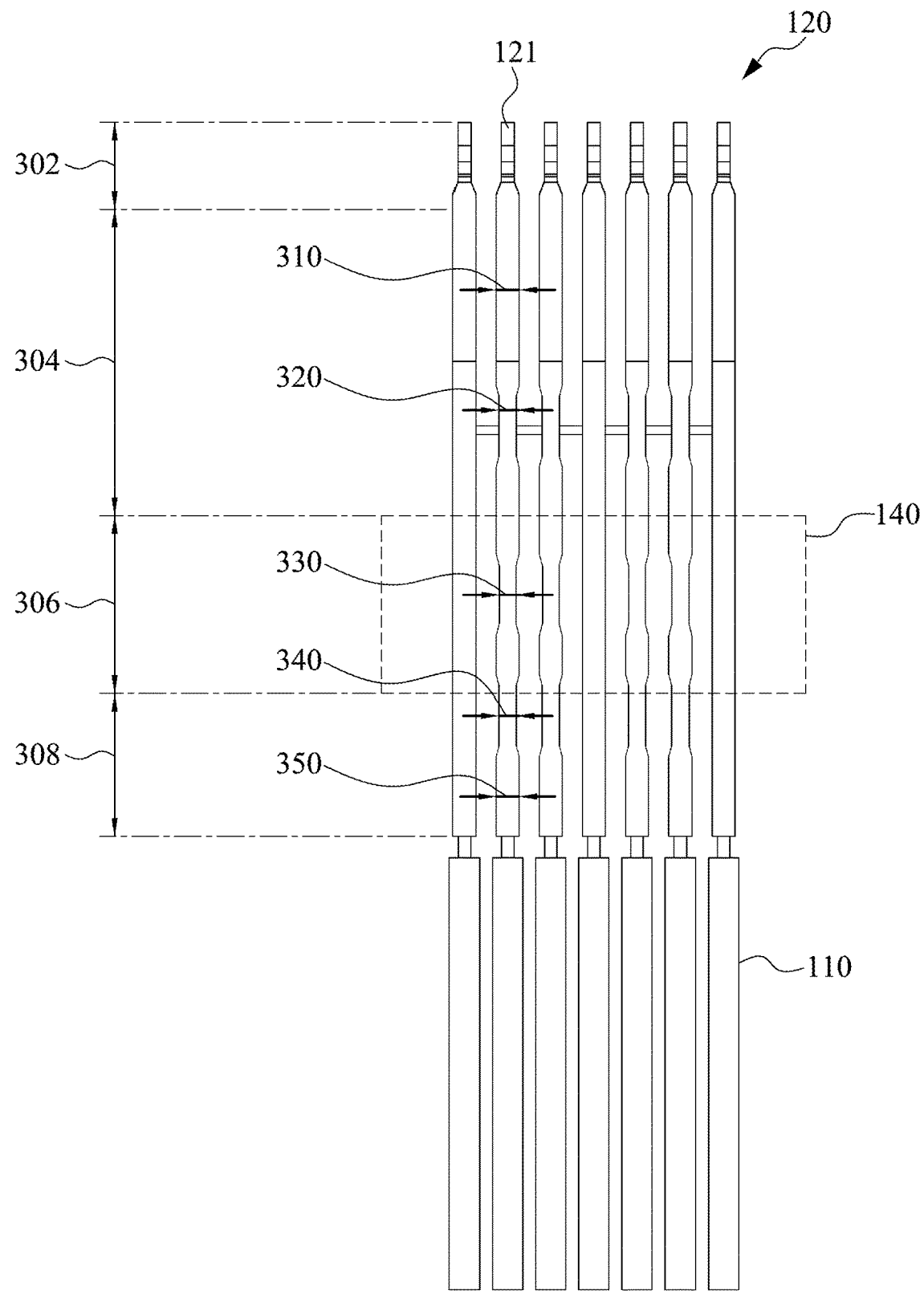
FIG. 3 illustrates a schematic front view showing electrical contacts of a cable assembly of an electronic signal processing device according to one embodiment of the present invention.

FIG. 1 illustrates a schematic perspective diagram showing an electronic signal processing device according to one embodiment of the present invention, FIG. 2 illustrates a schematic rear perspective diagram thereof, and FIG. 3 illustrates a schematic front view of electrical contacts of a cable assembly thereof.

As shown in FIG. 1, an electronic signal processing device 600 includes a printed circuit board 610, a signal processing chip 620, a plurality of conductive lines 640, a plurality of copper pads 650 and a fixing device 630.

The signal processing chip 620 is mounted on the printed circuit board 610, the conductive lines 640 are formed on the printed circuit board 610 to electrically connect to the signal processing chip 620, the copper pads 650 are respectively formed at end portions of the conductive lines 640. The fixing device 630 is also mounted on the printed circuit board 610 to expose the copper pads 650 for connecting to a cable assembly 100. The copper pads 650 can directly connect to the electrical contacts 120 of the cable assembly 100, and the printed circuit board 610 is not necessary to install a connector to connect to the cable assembly 100. The electrical contacts 120 of the cable assembly 100 are directly connect to the copper pads 650, e.g. golden fingers, of the printed circuit board 610 so as to reduce the attenuation or variation of the signal, thereby improving the signal integrity, and increasing the quality and speed of signal transmission.

In some embodiments, the fixing device 630 includes a U-shaped protecting shell 632 and a protecting lid 634, the U-shaped protecting shell 632 is fixed on the printed circuit board 610 to form an accommodating space 636 and allow the copper pads 650 to be exposed to the accommodating space 636. In addition, the protecting lid 634 is pivoted to the U-shaped protecting shell 632 with a hinge 635 and the protecting lid 634 is able to cover on the U-shaped protecting shell 632.

In some embodiments, the protecting lid 634 includes a fixing protrusion 637, e.g. a retractable steel ball or a protrusion. When the protecting lid 634 covers on the U-shaped protecting shell 632, the fixing protrusion 637 of the protecting lid 634 couples to a fixing hole 633 of the U-shaped protecting shell 632 to fix the protecting lid 634 on the U-shaped protecting shell 632. Alternatively, the positions of the fixing protrusion 637 and the fixing hole 633 can be exchanged or another fixing device is utilized to fix the protecting lid 634 on the U-shaped protecting shell 632 without departing from the spirit and scope of the invention.

In some embodiments, the U-shaped protecting shell 632 includes a positioning fillister 638 for positioning a positioning flange 138 of the cable assembly 100, and when the protecting lid 634 is covered on the U-shaped protecting shell 632, a pressing flange 639 of the protecting lid 634 can press the positioning flange 138 of the cable assembly 100 in the positioning fillister 638 to effectively allow copper pads 650 of the printed circuit board 610 electrically connecting to the electrical contacts 120 of the cable assembly 100 so as to stably transmit signals therebetween.

In some embodiments, the electrical contacts 120 of the cable assembly 100 include a plurality of varying width electrical contacts 121. In addition, the varying width electrical contacts 121, e.g. data transmitting electrical contacts, can effectively transmit high frequency data signals.

Referring to FIGS. 1-3, the cable assembly 100 further includes a plurality of wires 110, a plurality of electrical contacts 120, a protecting cover 130 and a fixing holder 140.

The wires 110 are respectively connected to the electrical contacts 120, and the fixing holder 140 fixes the electrical contacts 120. Furthermore, the fixing holder 140, the wires 110 and the electrical contacts 120 are fixed in the protecting cover 130.

The electrical contacts 120 sequentially include contacting portions 302, exposing portions 304, fixing portions 306 and wire connecting portions 308. The contacting portions 302 of the electrical contacts 120 are utilized to electrically connect to golden fingers of a printed circuit board, e.g. a printed circuit board of an electronic device, for example, a computer motherboard.

The wire connecting portions 308 of the electrical contacts 120 are electrically connected to the wires 110 by welding or the like.

The electrical contacts 120 at least includes a varying width electrical contact 121 to transmit data signals and improve the signal integrity (SI) with the width change thereof so as to improve the signal transmitting quality and speed, and especially while transmitting a high frequency signals, for example, a 5 gigahertz (GHz) or above signals.

The varying width electrical contact 121 can include a first width 310, a second width 320, a third width 330, a fourth width 340 and a fifth width 350.

In some embodiments, the first width 310 and the second width 320 are located at the exposing portion 304, the first width 310 is adjacent to the contacting portion 302, and the second width 320 is located between the first width 310 and the fixing portion 306. The width of the first width 310 is different from that of the second width 320 to change the width of the varying width electrical contacts 121 thereby effectively improving signal integrity, and further improving signal transmission quality and speed, particularly for high frequency signals.

In some embodiments, the first width 310 is wider than the second width 320. In other embodiments, the first width 310 is narrower than the second width 320.

In addition, the third width 330 is formed in the fixing portion 306. In some embodiments, the first width 310 is wider than the third width 330. In other embodiments, the first width 310 is narrower than the third width 330.

The fourth width 340 and the fifth width 350 are formed in the wire connecting portion 308. In some embodiments, the first width 310 is wider than the fourth width 340. In other embodiments, the first width 310 is narrower than the fourth width 340.

In some embodiments, the first width 310 is equal to the fifth width 350. In other embodiments, the first width 310 is not equal to the fifth width 350.

According to the finished experimental results, when high frequency signal transmission is performed by using the varying width electrical contact 121, signal integrity can be effectively improved, thereby improving the quality and speed of the signal thereof.

Accordingly, the electronic signal processing device can not only be conveniently coupled to the cable assembly, but also the electrical contacts of the cable assembly can directly contact the copper pads of the circuit board so as to reduce the required connection components between the signal processing chip and the wire, thereby effectively improving the signal integrity and increasing the quality and speed of signal transmission. In addition, because that the widths of the electrical contacts are changed to improve the signal integrity, the signal integrity of the high frequency signal can be improved more effectively, and furthermore the quality and speed of the high frequency signal transmission are also effectively increased.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. An electronic signal processing device, comprising:
   a printed circuit board;
   a signal processing chip mounted on the printed circuit board;
   a plurality of conductive lines formed on the printed circuit board and electrically connected to the signal processing chip;
   a plurality of copper pads respectively forming at end portions of the conductive lines; and
   a fixing device mounted on the printed circuit board to expose the copper pads for connecting to a cable assembly, wherein the fixing device comprises a U-shaped protecting shell fixed on the printed circuit board, the U-shaped protecting shell comprises a positioning fillister to couple to a positioning flange of the cable assembly, and the protecting lid further includes a pressing flange to press the positioning flange of the cable assembly in the positioning fillister.

2. The electronic signal processing device of claim 1, wherein the fixing device further comprises a protecting lid coupled to the U-shaped protecting shell.

3. The electronic signal processing device of claim 2, wherein the protecting lid comprises a hinge pivoted to the U-shaped protecting shell.

4. The electronic signal processing device of claim 2, wherein the protecting lid comprises a fixing protrusion and the U-shaped protecting shell comprises a fixing hole to fix the protecting lid on the U-shaped protecting shell.

5. The electronic signal processing device of claim 1, wherein the cable assembly includes a plurality of electrical contacts.

6. The electronic signal processing device of claim 5, wherein the electrical contacts comprises a plurality of varying width electrical contacts.

7. The electronic signal processing device of claim 6, wherein the varying width electrical contacts are electrical contacts for transmitting signals.

* * * * *